United States Patent [19]

Baker et al.

[11] 4,444,531

[45] Apr. 24, 1984

[54] AIR TRACK APPARATUS

[75] Inventors: Charles C. Baker, Wilmington; Perry S. Banks, Somerville, both of Mass.; Patrick F. Raduazzo, Milford, N.H.

[73] Assignee: GCA Corporation, Bedford, Mass.

[21] Appl. No.: 326,399

[22] Filed: Dec. 1, 1981

[51] Int. Cl.³ ............................................... B65G 51/02
[52] U.S. Cl. ...................................... 406/88; 271/195; 226/97
[58] Field of Search .................... 406/88, 89; 271/195, 271/97, 238, 248, 240; 226/97

[56] References Cited

U.S. PATENT DOCUMENTS

| 2,805,898 | 9/1957 | Willis, Jr. | 406/88 |
| 3,350,140 | 10/1967 | Strydom | 406/88 |
| 3,395,943 | 8/1968 | Wilde et al. | 406/88 |
| 4,131,320 | 12/1978 | Volat et al. | 406/88 |

Primary Examiner—John J. Love
Assistant Examiner—L. E. Williams
Attorney, Agent, or Firm—Kenway & Jenney

[57] ABSTRACT

In the air track system disclosed herein, reticles used in a microlithographic imaging system are transported on an air track and are guided from one side by means of vertically directed air jets which maintain an essentially controlled gap between the edge of the reticle and a side rail extending along the track.

3 Claims, 6 Drawing Figures

AIR TRACK APPARATUS

BACKGROUND OF THE INVENTION

The present invention relates to an air track system and more particularly to an air track edge guide construction useful in transporting reticles for integrated circuit microlighography.

Air track systems of various types have been devised for transporting many different kinds of articles. In particular, air tracks have found extensive usage in the semiconductor industry for transporting silicon wafers from magazines to work stations and back and also between work stations. In general, these air track transporting systems employ an essentially flat horizontal surface incorporating a number of ports for introducing an airflow which establishes an air cushion under the articles to be transported. Usually the article being transported is directly or mechanically constrained to the desired path although various self-centering systems have been devised for causing light objects, such as semiconductor wafers, to follow the track without direct mechanical constraint.

In some systems where it has been desired to constrain the path of a larger article without contact, air bearings have been provided along sidewalls of a track as well as under the track. In such cases the sidewalls act in generally the same manner as the track bed; that is, an air cushion is generated between the article and a wall, and the air jets creating the cushion are generally directed at the article, i.e. laterally in the case of the sidewalls. In the case of relatively thin articles, however, e.g., reticles or semiconductor wafers, such laterally directed air jets have not proven particularly effective.

Particularly in the case of reticles, it is typically desired to precisely control the movement and location of the reticles since, at the work station, the reticle must be very precisely positioned and aligned before it is to expose a pattern on the semiconductor wafer as part of the photolithographic process. It is also highly desirable to avoid, wherever possible, direct physical contact with a reticle since any abrasion at all may generate microscopic particles of dust which, if they end up on the surface of the reticle, can cause imperfections in the semiconductor devices being manufactured and thereby significantly reduce the yield of good integrated circuit devices from the semiconductor wafers.

Among the several objects of the present invention may be noted the provision of air track apparatus for transporting articles without direct mechanical contact; the provision of such an apparatus which is suitable for transporting reticles used in the microlithography of integrated circuit manufacture; the provision of such a system which precisely controls the location and orientation of the articles being transported; the provision of such an apparatus which will guide an article from one side of an air track on which the article is being transported; the provision of such apparatus which is highly reliable and which is of relatively simple and inexpensive construction. Other objects and features will be in part apparent and in part pointed out hereinafter.

SUMMARY OF THE INVENTION

Briefly, apparatus of the present invention is operative to transport articles having at least one flat peripheral surface. The articles are transported along an air track bed providing a flat horizontal surface including ports for producing an airflow to establish an air cushion under the articles to be transported. A rail structure extends along one side edge of the bed means and provides an essentially vertical flat surface adjacent the track. Spaced along the interface between the bed means and the rail are a series of air jet forming means directed vertically along the vertical flat surface. As an article passes along the track, the air jets provide a dynamic interaction between the rail and the peripheral flat surface on the article which maintains a desirable spacing between the rail and the article, notwithstanding significant lateral forces in either direction.

BRIEF DESCRIPTION OF THE DRAWINGS

Corresponding reference characters indicate corresponding parts throughout several views of the drawings.

DESCRIPTION OF THE PREFERRED EMBODIMENT

Figure 1:
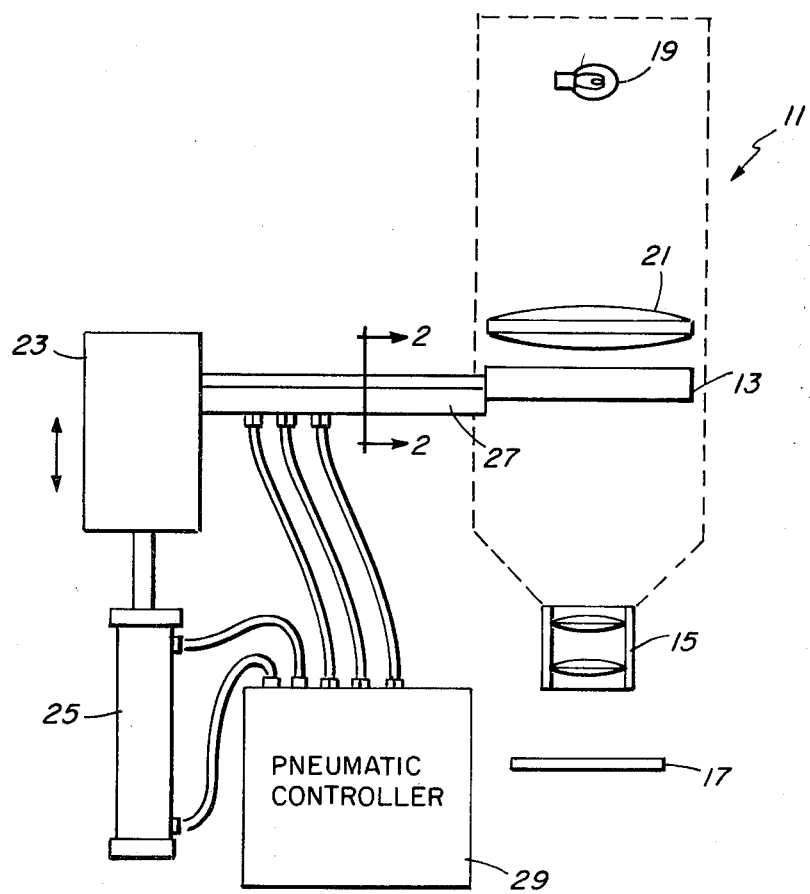
FIG. 1 is a diagram representing the use of air track apparatus in accordance with the present invention for transporting reticles between a magazine and a microlithographic imaging system.

Referring now to FIG. 1, a micro-lithographic imaging system of the type used in manufacturing integrated circuits is indicated generally by reference character 11. In this system, a pattern contained on a reticle held in a platen 13 is projected, by means of a high resolution lens 15, onto a resist coated semiconductor wafer 17. A light source and a conventional condenser are represented diagrammatically by reference characters 19 and 21, respectively. As different reticles are required at different stages in the manufacturing process, even for a single type of integrated circuit device, a magazine 23 is provided for holding a plurality of reticles in a vertically spaced array. Magazine 23 may be indexed vertically by means of a suitable electric or pneumatic drive, such a drive being indicated at 25.

A selected reticle may be transported back and forth between the magazine 23 and the platen 13 by means of an air track system 27 constructed in accordance with the present invention. A suitable pneumatic controller 29 is provided for operating the air track 27 and the vertical indexer 25. As will be understood, sequencing will typically be provided by an overall computer driven controller for the microlithographic system.

The reticles employed in such a system may typically comprise chrome on glass plates which are approximately five inches square and 0.090 inches thick.

Figure 2:
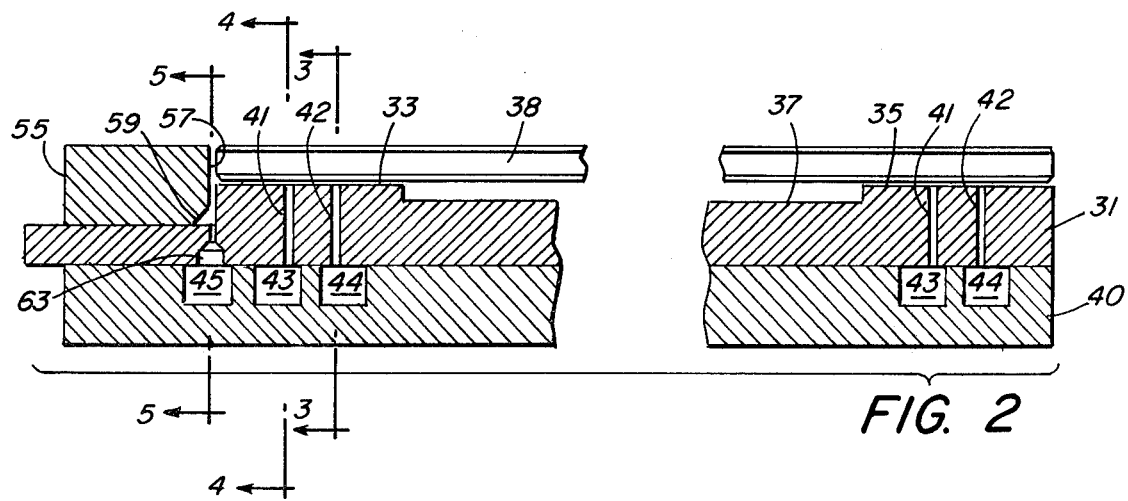
FIG. 2 is a cross-sectional view taken substantially on line 2—2 of FIG. 1 showing the construction of the air track and edge guide in accordance with the present invention.
Figure 3:
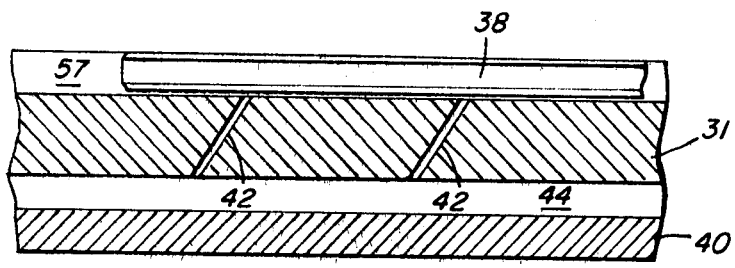
FIG. 3 is a cross-sectional view taken substantially on line 3—3 of FIG. 2.
Figure 4:
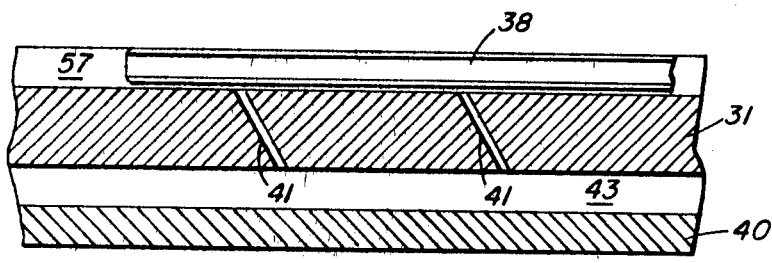
FIG. 4 is a cross-sectional view taken substantially on the line 4—4 of FIG. 2.
Figure 5:
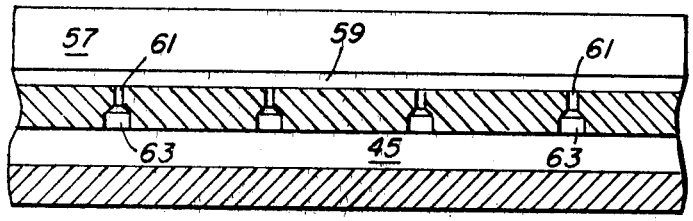
FIG. 5 is a cross-sectional view taken substantially on the line 5—5 of FIG. 2.

Referring now to FIG. 2, the basic air track bed structure is indicated by reference character 31. In that the reticles being transported are light and require support only over a portion of the cross-sectional area, the bed structure 31 comprises a pair of raised ways or lands, 33 and 35, separated by a recessed section 37. The reticle itself is indicated by reference character 38. Two sets of ports 41 and 42 are drilled into each of the ways. The sets of ports are oppositely angled as illustrated in FIGS. 3 and 4 so the reticle can be moved in either direction along the track by applying air pressure to the appropriate set of ports. A plenum structure 40 coupled to the underside of the bed structure 31 provides separate plenums 43 and 44 for energizing the respective sets of ports 41 and 42.

A rail structure 55 is provided along one side of the bed structure 11. The rail structure provides an essential vertical flat surface 57 extending along and adjacent the basic air track. As may also be seen, this flat surface extends somewhat below the flat horizontal surface of the ways 33, there being a narrow gap between the rail structure and the side of the way 33.

Spaced along the interface between the air track bed 31 and the rail 55 are a plurality of vertically aimed ports 61 which communicate with a further supply manifold 45. When manifold 45 is pressurized, e.g., to a pressure of 25 psig, the ports 61 generate a plurality of discrete air jets which flow vertically along the surface 57. The lower edge of the rail 35 is bevelled as indicated at 59 to facilitate the attachment of the air jet to the vertical rail surface. The ports 61 are formed by pre-boring, as indicated at 63, and then drilling the ports through closely adjacent the side of the land 13. In one particular embodiment of the invention the ports were 0.018 inches in diameter and were spaced at 1.25 inch intervals along the rail.

In operation, the air jets along the rail would establish a spacing between the reticle 38 and the rail 55 of about 0.001 inches without allowing any actual contact between the reticle and the rail. While the dynamics of the situation are clearly complex, it appears that the high velocity jet creates a region of low pressure which pulls the reticle toward the rail, but that as the reticle closely approaches the rail, constriction of the jet causes pressure to build up and prevent actual contact. At flow rates which were empirically too low, e.g. flows created by plenum pressure under 15 psig, an oscillatory situation would arise, apparently due to vortex shedding. However, by using increased pressures, oscillation was avoided, apparently by raising the vortex shedding frequency above the resonant frequency of the system formed by the mass of the reticle and the resonance of the air in the gap between the reticle and the rail. As indicated previously, the air jets would maintain the desired spacing quite closely even if the track were inclined slightly toward or away from the rail. Operation at pressures in the plenum of up to 65 psig has proven satisfactory.

As illustrated, the guiding system of the present invention operates in connection with the reticles having a peripheral flat surface of length sufficient to span a number of air jets. While this requirement is easily met by the industry standard reticles which are typically square, it also appears that silicon wafers may be transported using this technique if the orientation flat normally incorporated in such wafers is initially brought into contact with the rail and a sufficient number of ports are provided so that the flat spans a number of such ports.

The control of spacing between the rail and the article being transported is best if the side of the article is flat vertically over a significant portion of its height. Though reticles are typically bevelled, as illustrated, this bevelling does not degrade the operation of the guidance system of the present invention if the bevels do not occupy a major portion of the thickness of the reticle. The control, however, does improve as the depth of the bevels is minimized. While a reticle with sides rounded from top to bottom can be controlled if the track is essentially flat, the margin of control is considerably less than if the edges of the reticle include straight sided portions as illustrated.

Figure 6:
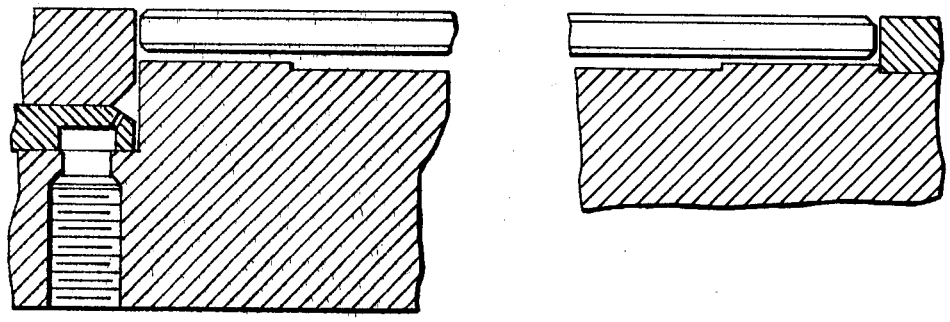
FIG. 6 is a cross-sectional view similar to FIG. 2 but showing an alternate arrangement of the air jets.

It is preferred that the vertical face 57 of the rail 55 extend down below the horizontal flat surface of the track bed in the manner illustrated with a uniform gap between the rail and the edge of the track. This apparently facilitates the formation of the jet as does the bevelling of the lower edge of the rail as illustrated at 59. In this regard it should be noted that with this uniform gap, it is not necessary that the direction of the jet be exactly verticle. An arrangement as shown in FIG. 6 has also been utilized successfully although the orientation illustrated in FIG. 2 is preferred for ease of manufacture.

In that the edge guiding system of the present invention provides a restoring force against displacements either toward or away from the rail, it can be seen that it is unnecessary and in fact disadvantageous to provide a similar rail on the opposite side of the track. Rather, attempts to use such rails produced an instable operation apparently due to fighting between the two control actions. However, it should be understood that a rail may be included without the air jets just as a mechanical limit of lateral position.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

We claim:

1. Air track apparatus for transporting articles having at least one peripheral flat surface, said apparatus comprising:
   air track bed means providing a flat horizontal surface including ports for introducing an air flow to establish an air cushion under articles to be transported;
   a rail extending along one side edge of said bed means providing an essentially vertical flat surface adjacent said track; and
   spaced at intervals along the interface between said bed means and said rail, a series of air jet forming means directed vertically to provide air jets flowing in close proximity across said vertical flat surface.

2. Air track apparatus for transporting reticles, said apparatus comprising:
   elongate air track bed means providing a flat essentially horizontal surface including ports along the sides of the horizontal surface for introducing an air flow between a reticle being transported and said horizontal surface to establish an air cushion under the reticle;
   a rail extending along one side edge of said bed means providing an essentially vertical flat surface adjacent said track, there being a narrow essentially uniform gap between the flat surface and the side of the air track bed means; and spaced at intervals along the gap between said bed means and said rail and below said horizontal surface, a series of air jet forming ports directed vertically across said vertical flat surface.

3. Apparatus as set forth in claim 2 wherein said rail includes, below the horizontal surface of said bed means, a bevel which effectively widens said gap adjacent said jet forming ports.

* * * * *